(12) United States Patent
Hsieh et al.

(10) Patent No.: US 7,212,939 B2
(45) Date of Patent: May 1, 2007

(54) METHOD AND SYSTEM FOR TIMING MEASUREMENT OF EMBEDDED MACRO MODULE

(75) Inventors: Chen-Hui Hsieh, Chu-Pei (TW); Hau-Tai Shieh, Hsinchu (TW); Tao-Ping Wang, Hsinchu (TW)

(73) Assignee: Taiwan Semiconductor Manufacturin Co., Ltd., Hsin-Chu (TW)

( * ) Notice: Subject to any disclaimer, the term of this patent is extended or adjusted under 35 U.S.C. 154(b) by 7 days.

(21) Appl. No.: 11/061,020

(22) Filed: Feb. 18, 2005

(65) Prior Publication Data

US 2006/0190215 A1    Aug. 24, 2006

(51) Int. Cl.
   *G01R 27/28* (2006.01)
(52) U.S. Cl. .................. 702/117; 702/125; 713/400
(58) Field of Classification Search ............. 702/57, 702/79, 117, 120, 124, 125, 176–178; 368/107, 368/113; 713/401
   See application file for complete search history.

(56) References Cited

U.S. PATENT DOCUMENTS

| | | | | |
|---|---|---|---|---|
| 4,878,209 A | * | 10/1989 | Bassett et al. | 368/113 |
| 5,822,228 A | * | 10/1998 | Irrinki et al. | 714/718 |
| 6,014,033 A | * | 1/2000 | Fitzgerald et al. | 324/765 |
| 2002/0031199 A1 | * | 3/2002 | Rolston et al. | 375/356 |

* cited by examiner

*Primary Examiner*—Manuel L. Barbee
(74) *Attorney, Agent, or Firm*—Duane Morris LLP

(57) ABSTRACT

A method and system is presented for measuring a data access time of an embedded macro module in an integrated circuit. A single external test signal is inputted into the embedded macro module for enabling a data input therein and extracting a data output therefrom. A pulse width of the single external test signal is incrementally increased until a latch of the data output is observed. Then, the data access time is obtained, as its substantially equals a time interval of the increased pulse width.

18 Claims, 4 Drawing Sheets

US 7,212,939 B2

METHOD AND SYSTEM FOR TIMING MEASUREMENT OF EMBEDDED MACRO MODULE

BACKGROUND

The present invention relates generally to large scale integrated (LSI) chip designs, and more particularly to a method and system for testing the data access time of a macro module embedded therein.

Due to the extremely tight timing constraints of today's LSI system on chip (SOC), timing parameters of an embedded macro module are a critical synthesis parameter. Therefore, it is imperative that measurements of the timing parameters of these embedded macros are performed, accurately and adequately.

For example, random access memory (RAM) macro modules and the like which are embedded within such LSI chips are always surrounded by intervening circuitries including, for example, logic elements, and input/output (I/O) interface circuits. As a result, the embedded macro modules are not directly accessible from the input and output terminals of an integrated circuit chip. The intervening circuitry causes on-chip time delays associated with input and output signals. These delays prohibit accurate timing measurement between, for example, macro-enable signals and test signals during a test, since the associated time delay caused by the intervening circuitries for a given signal is unknown.

While various conventional methods and devices exist, the strategy of timing measurements is to compensate for the on-chip time delays. For example, these test methods and devices usually include complicated elements that bypass the intervening circuitry so that the macro module is directly accessible from primary inputs ts. However, this not only complicates the circuit design, but also makes it hard to obtain an accurate timing measurement.

Therefore, desirable in the art of testing timing parameters of embedded macro modules is an improved method and system to accurately measure the timing parameters, without excessively complicating the circuit design.

SUMMARY

In view of the foregoing, a method and system is presented for measuring a data access time of an embedded macro module in an integrated circuit. In one embodiment, the method includes inputting a single external test signal into the embedded macro module for enabling a data input therein and latching a data output therefrom. A pulse width of the single external test signal is incrementally increased until a latch of the data output is observed. Then, the data access time is obtained, as its substantially equals a time interval of the increased pulse width.

Although the invention is illustrated and described herein as embodied in the method, it is nevertheless not intended to be limited to the details shown, since various modifications and structural changes may be made therein without departing from the spirit of the invention and within the scope and range of equivalents of the claims.

DESCRIPTION

Figure 1:
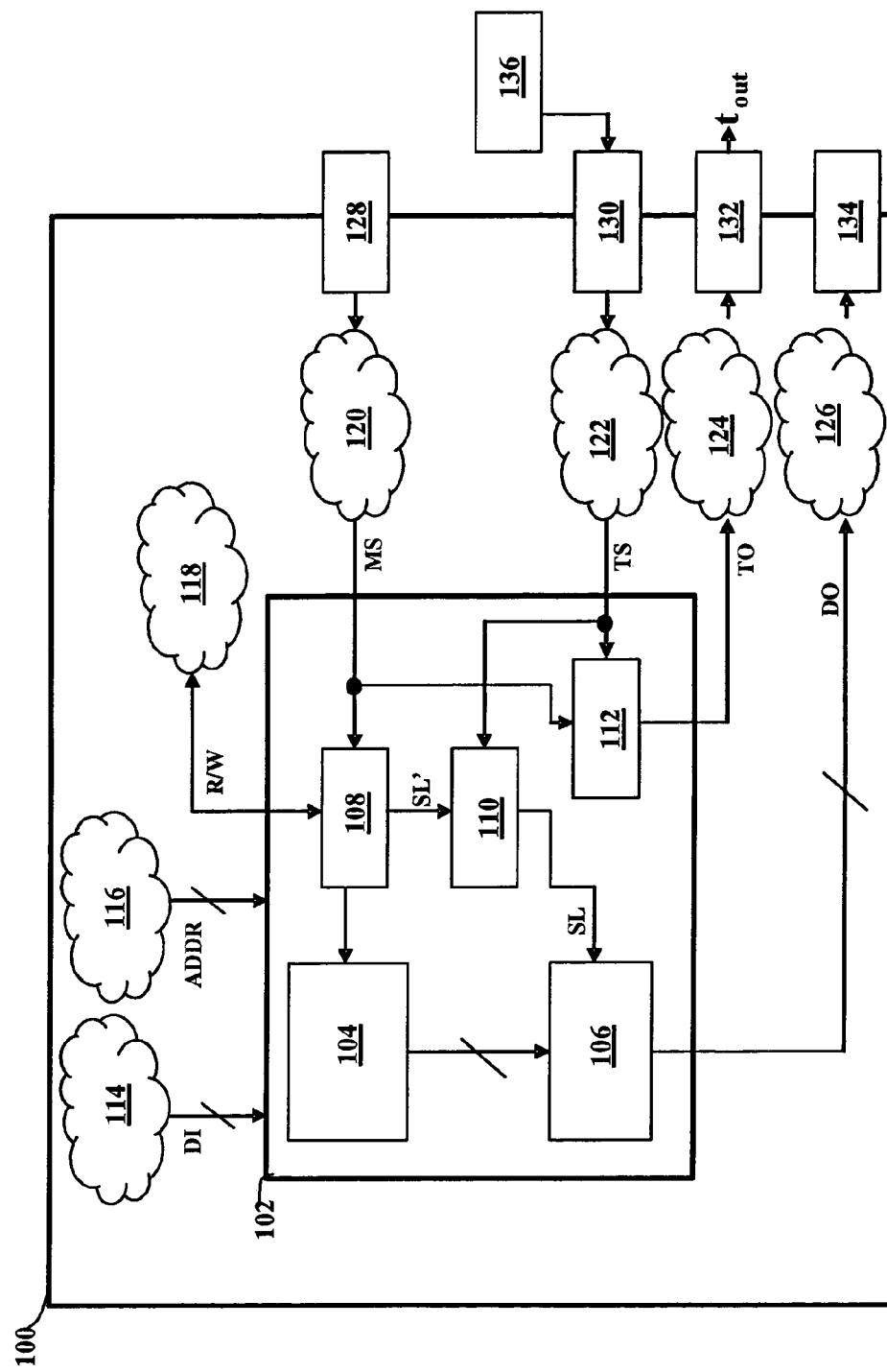
FIG. 1 presents a block diagram of a conventional semiconductor device under a test operation of timing parameters.

FIG. 1 presents a block diagram of a conventional LSI semiconductor device 100. The device 100 has an embedded memory macro module 102, which further includes a memory array 104, a latch module 106, a control module 108, a latch control module 110 and a test strobe (TS) latch 112. The device 100 also includes interfacing logic circuitries 114, 116, 118, 120, 122, 124, and 126 associated respectively with data input (DI), address (ADDR), read/write (R/W), macro-select (MS), test strobe (TS), test output (TO) and data output (DO) lines. The device 100 further includes receivers 128 and 130, and drivers 132 and 134. The driver 132 provides a test output signal $t_{out}$. The MS line extends from the receiver 128 to the control module 108 and to the TS latch 112 through the logic circuitry 120. A signal on the MS line activates the memory array 104. The TS line extends from the receiver 130, through the logic circuitry 122, to the TS latch 112 and the latch control module 110. The TO line extends from the TS latch 112, through the logic circuitry 124, to the driver 132. The DO line extends from the latch module 106, through the logic circuitry 126, to the driver 134.

Figure 2:
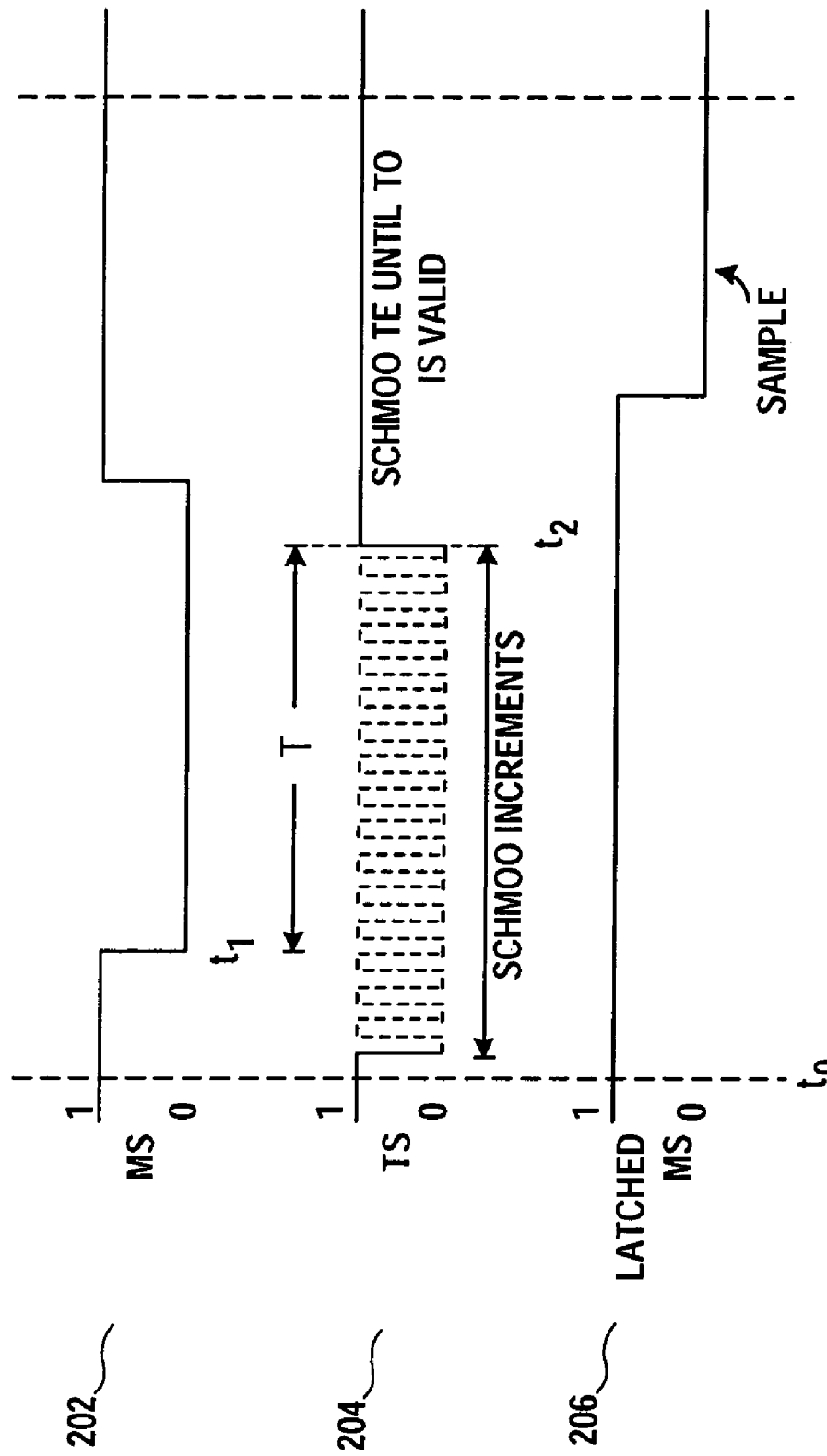
FIG. 2 presents a timing diagram of the test operation of the conventional semiconductor device.

FIG. 2 presents a timing diagram of a testing operation of the data access time for the memory array 104 in FIG. 1. The timing diagram includes graphs 202, 204 and 206. Referring to FIGS. 1 and 2, the graphs 202 and 204 plot signals on the MS and TS lines, while the graph 206 plots a latched MS signal, which is the signal on the TO line. Both the signals on the TS and MS lines are needed in order to test the data access time of the memory array 104. However, due to the interfacing logic circuits, such as 120 and 122, there might be a timing delay between the signals on the TS and MS lines. The timing delay must be found out and compensated, before the two signals can properly be used to test the data access time.

With reference to both FIGS. 1 and 2, a pulse signal on the MS line is first supplied from the receiver 128. The signal on the MS line has a leading edge (LE) at a user-specified time $t_1$. A signal on the TS line is supplied with respect to the time $t_0$ from the tester 136 through the receiver 130. In the graph 202, the signal is adapted to a "schmoo" cycle until a user-specified time $t_2$. During the schmoo cycle, the waveform of the signal on the TS line strobes in an up-and-down manner. The TS latch 112 functions as a D filp-flop, in which the MS signal serves as an input signal and the TS signal serves as a clock. The user-specified time $t_2$ is incrementally increased until the LE is captured by the "schmoo portion" of the TS signal. Whether LE is captured can be determined by observing the latched MS signal on the TO. Thus, the time difference or time delay T between the MS and TS signals can be determined by subtracting the user-specified time $t_1$ from the user-specified time $t_2$.

One shortcoming of the conventional device 100 is that it requires two external signals on MS and TS lines for a testing operation. Before calculating the data access time of the memory array 104, their timing delays must be determined first. However, there is an inherent timing skew between the two signals, thereby rendering it hard to attain an accurate timing measurement. The issue of timing skew becomes even more important with the tighter timing tolerances required by increasing data throughput of ICs. In addition, the two external signals require a more complicated circuit layout. This increases the difficulties of the fabrication of device 100.

This invention provides a method and system for measuring the timing parameters of an embedded macro module by using the leading and trailing edges of a single external test signal. In the following description, a memory macro module is used as an example for illustration purposes of the present invention. However, it is noted that this invention can also be applied to other types of macro modules.

Figure 3:
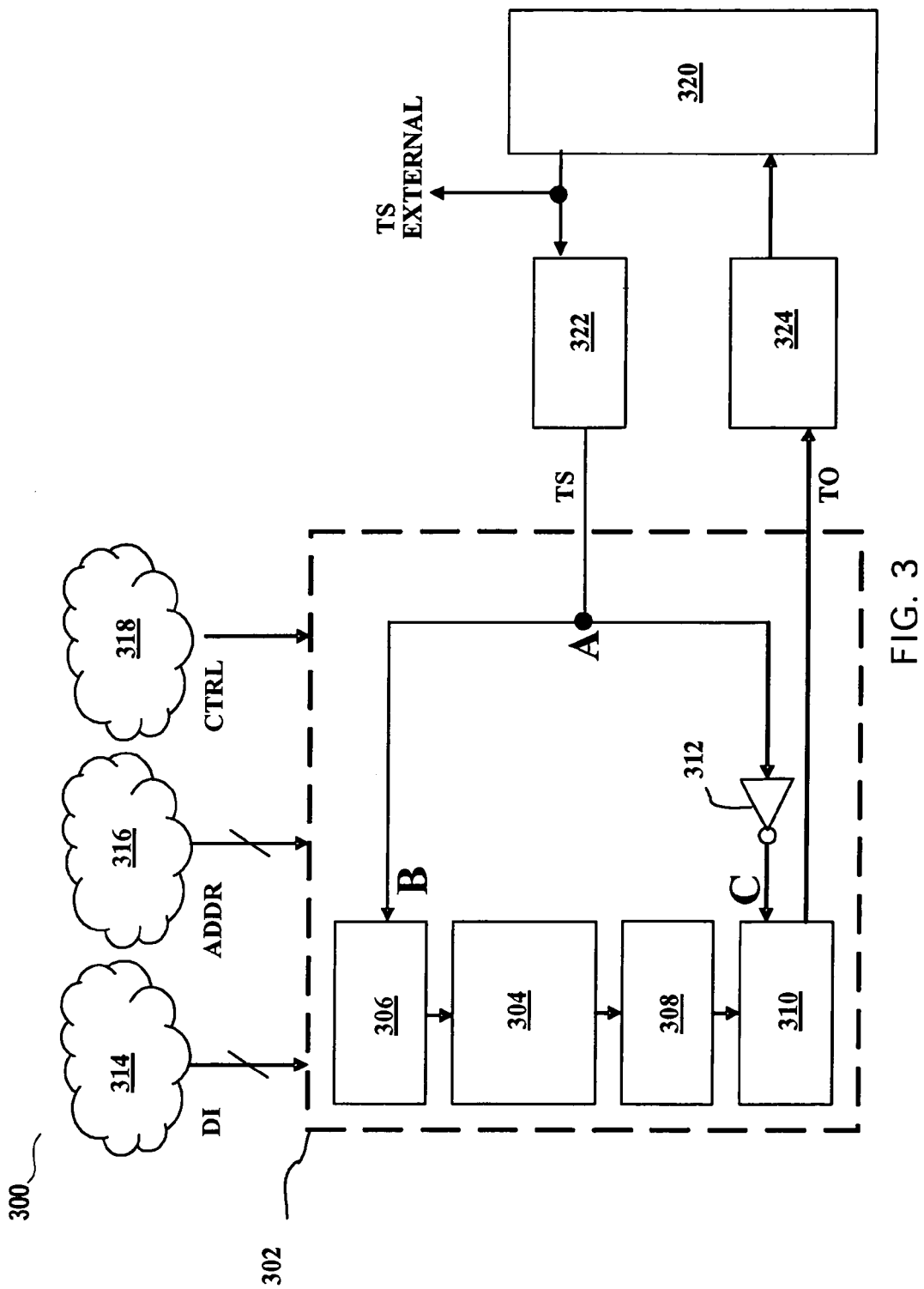
FIG. 3 presents a simplified block diagram of a semiconductor device under a test operation of timing parameters, in accordance with one embodiment of the present invention.

FIG. 3 presents a block diagram of a semiconductor device 300 in accordance with one embodiment of the present invention. In this embodiment, only one external test signal is needed to obtain an accurate measurement of the timing parameters, such as the data access time, of an memory array 304 in an embedded memory macro module 302. Besides the memory array 304, the embedded memory macro module 302 includes a first latch control module 306, a latch module 308, a second latch control module 310 and an inverter 312. The latch module 308 may include sense amplifiers, output terminals and latches. The latch module 308 basically functions as a detector to detect whether an expected data has been read from the memory array. The embedded memory macro module 302 receives data inputs, addresses and control parameters via DI, ADDR and CTRL lines, respectively, from logic circuitries 314, 316 and 318. The first latch control module 306 is coupled to the memory array 304 for controlling a data input thereinto. The second latch control module 310 is associated with the memory array 304 through the latch module 308 for controlling a data output therefrom. A tester module 320 is coupled to the first and second latch control modules 306 and 310 via an I/O circuitry 322, through a first branch and a second branch of a test line, respectively, for inputting a single test signal from outside of the embedded memory macro module 302 to the memory array 304. Again, it is noted that the memory array 304 is used for illustration purposes, and can be replaced with any other types of device arrays.

The single external test signal on the TS line is generated by the tester module 320 and is sent to an I/O circuitry 322. The I/O circuitry 322 inputs the external test signal on the TS line into the embedded memory macro module 302 at a point A. The TS line splits at the point A into a first branch and a second branch, connecting to the first latch control module 306 at a point B and the second latch control module 310 at a point C, respectively. Thus, the external test signal splits into a first control signal and a second control signal, connecting to points B and C, respectively.

During the IC layout design stage, the IC designer insures that the propagation delay of the A-B path, i.e., the first branch, is substantially equal to the propagation delay of the A-C path, i.e., the second branch. Therefore, no timing effect or signal skew is induced. This equal propagation delay can be achieved by making the A-B path and the A-C path of the same length. The propagation delay is a critical parameter that must be designed carefully to insure the proper access timing measurements of the embedded memory macro module 302. Since the inverter 312 is connected to the second latch control module 310 through the second branch of the test line, and the two paths provide the external test signal with substantially the same propagation delays, the first and second control signals are about 180 degrees out of phase.

The second latch control module 310 outputs a signal on a TO line to the tester module 320 via an I/O circuitry 324 that indicates when the embedded memory macro module 302 has accessed the proper data required for the test. The data-log of the tester module 320 should also record the pulse-width (PW) of this external test signal as an indication of tat access time. In other words, this embodiment employs only one external test signal on the TS line to fully determine the data access time of the memory array 304, instead of using two signals on the MS and TS lines in the conventional design as explained in FIGS. 1 and 2.

Figure 4:
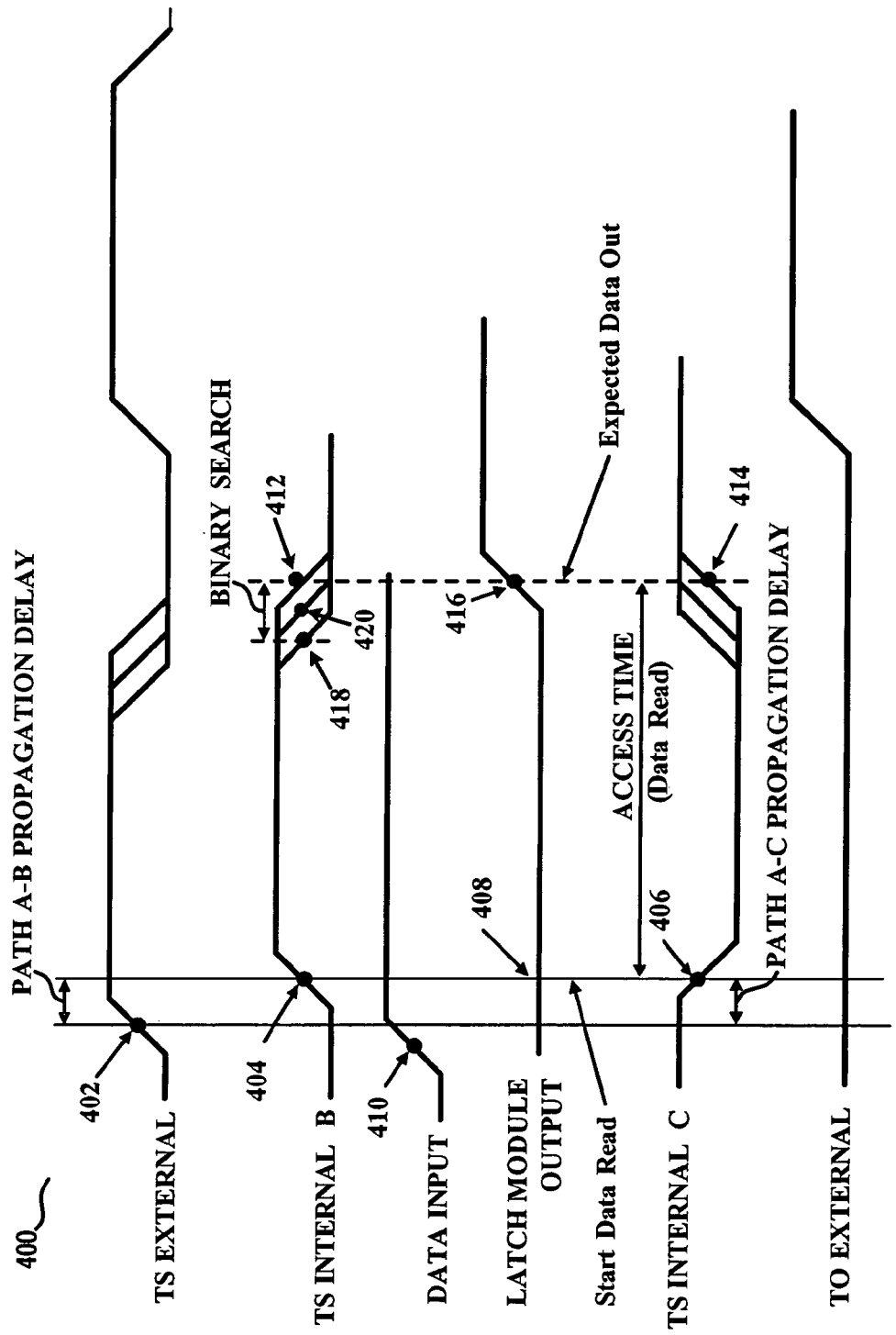
FIG. 4 presents a timing diagram of the test operation of the semiconductor device, in accordance with one embodiment of the present invention.

FIG. 4 presents a timing diagram 400 of the testing operation of the device 300 in accordance with one embodiment of the present invention. With reference to FIGS. 3 and 4, the tester module 320 generates a signal on the TS line, with a pulse-width less than the known manufacturer's specified timing specification of the embedded memory macro module 302. Further, the pulse-width is incrementally increased until a latched data output is observed. The external test signal on the TS line is generated by the tester module 320, and named "TS EXTERNAL." This signal is routed to the point B, called "TS INTERNAL B," which enables a data input from the logic circuitry 314 into the memory array 304. Meanwhile, this signal is also routed via the inverter 312 to the point C, called "TS INTERNAL C," which latches a data output from the memory array 304 through the latch module 308. The TS INTERAL B signal is in sync with the TS EXTERNAL signal, but with a delay equal to the A-B path propagation delay. The TS INTERNAL C signal is inverted by the inverter 312 with respect to the TS EXTERNAL signal, with a delay equal to the A-C path propagation delay. The IC designer designs the device 300 in a way that the A-B path propagation delay is identical to the A-C path propagation delay. Therefore, as shown in the timing diagram, the timing of the TS INTERNAL B and TS INTERNAL C signals are identical except that they are 180 degrees out of phase.

For illustration purposes, the rising edge of the TS EXTERNAL signal at a point 402 causes the TS INTERNAL B signal to rise at a point 404, after the A-B path propagation delay. Also, the rising edge of the TS EXTERNAL signal causes the TS INTERNAL C signal to fall at a point 406 after the A-C path propagation delay, which is designed to be equivalent to the A-B path propagation delay. The leading edge of the TS INTERNAL B signal at the point 404 enables the first latch control module 306 to start the "data read" operation. At the same time, the leading edge of the TS INTERNAL C signal at a point 406 disables the output of the second latch control module 310. Note that, while in this embodiment, the leading edge of the TS INTERNAL B is a rising edge, and the leading edge of the TS INTERNAL C is a falling edge, they can be made in a reversed way, as a choice of design.

In this embodiment, it is assumed that the data inputs from the logic circuitry 314 is available as required, at a point 410, by the embedded memory macro module 302 before the first latch control module 306 is enabled at the point 404. The tester module 320 incrementally increases a pulse-width of the TS EXTERNAL signal on the TS line in multiple test cycles, until a latch of the data output is observed on the TO line (illustrated as a signal LATCH MODULE OUTPUT in FIG. 4) by the tester module 320. This is called a "binary search" process. For example, initially the trailing edge of the TS INTERNAL B signal falls at a point of 418. Due to the data access delay, the latch module 308 outputs the data input at a point 410 with a timing delay at a point 416. It is noted that the incremental portion of the pulse width is largely determined by the tester based on some known information about the circuit. It can also be programmed so that through a trial-and-error process, an appropriate incremental portion can be used. The first latch control module 306 functions similarly to a D flip-flop in the sense that the DATA INPUT signal is latched by the TS INTERNAL B signal. As it can be seen from the timing diagram, at point 418 the LATCH MODULE OUTPUT signal has not risen yet. Therefore, no latched signal that has a rising edge can be observed on the TO EXTERNAL line by the tester module 320. In the next cycle, the tester module 320 increases the pulse width of the TS EXTERNAL signal with an incremental value. As a result, the trailing edge of the TS INTERNAL B signals falls at a point of 420. Again, at the point 420, no latched signal that has a rising edge can be observed on the TO line by the tester module 320, because the LATCH MODULE OUTPUT signal rises at a point 416 after the TS INTERNAL B signal falls. The incremental increasing process repeats, and tester module 320 increases the pulse width of the TS EXTERNAL signal with another incremental value. As a result, the trailing edge of the TS INTERNAL B signal falls now at a point of 412. At this time, the LATCH MODULE OUTPUT signal rises at the point 416, when the TS INTERNAL B signal falls at the point 412. Because the A-B and A-C paths provide the TS EXTERNAL signal with substantially the same propagation delay, the TS INTERNAL C signal rises at a point 414, which is the same point in time as the point 412. Like the first latch control module 306, the second latch control module 310 functions similarly to a D flip-flop in the sense that the LATCH MODULE OUTPUT signal is latched by the TS INTERNAL C signal. Therefore, the second latch control module 310 outputs the latched TO EXTERNAL signal through the I/O circuitry 324 with a rising edge observed by the tester.

The rising edge of the TO EXTERNAL signal may be observed at the tester with a timing delay after the common time slice of the points 412, 414 and 416. This delay may be caused by the interfacing circuits, such as the I/O circuitry 324. However, this has no effect on measuring the data access time of the embedded macro module 302. The data access time is defined as of the enablement of data read operation, i.e., the point 404, until the time of the data output, i.e., the point 416. This is equal to the original pulse width of the TS EXTERNAL signal plus additional incremental values, which can be tracked with the data log generated by the tester module 320. In this embodiment, the data access time is equal to the original pulse width of the original TS EXTERNAL signal plus two incremental values. The TO EXTERNAL signal is only for the tester module 320 to recognize if the latch has occurred.

This new methodology eliminates any timing skew issue presented in the conventional design. This new design is much simpler to incorporate into the design because it requires less internal test circuitries, and is also much simpler to test accurately. Furthermore, to improve on the efficiency of this methodology, the rising and falling edges of the external test signal can be used for alternatively to measure data "1" and "0" in one cycle.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for measuring a data access time of an embedded macro module in an integrated circuit, comprising:
   providing a single external test signal into the embedded macro module for extracting an output therefrom based on a predetermined input;
   continuously examining the output from the embedded macro module;
   incrementally increasing a pulse width of the single external test signal in one or more test cycles until the output is observed; and
   obtaining the data access time of the embedded macro module,
   wherein the data access time equals substantially a time interval of the increased pulse width.

2. The method of claim 1 wherein the providing a single external test signal further comprises:
   providing the single external test signal from a tester; and
   splitting the single external test signal into a first control signal for enabling the input to be provided to the embedded macro module, and a second control signal for latching the output from the embedded macro module.

3. The method of claim 2 wherein the first control signal and the second control signal are 180 degrees out of phase.

4. The method of claim 3 wherein the first control signal has a propagation delay substantially the same as that of the second control signal.

5. The method of claim 1 wherein the providing further includes examining the output from the embedded macro module by a latch.

6. The method of claim 5 wherein the latch includes a sense amplifier.

7. The method of claim 5 wherein the obtaining further includes:
   detecting the output by the tester; and
   calculating the data access time after considering a time delay of an input/output module of the circuit.

8. A system for measuring a data access time of an embedded macro module in art integrated circuit, comprising:
   a first latch control module coupled to the embedded macro module for controlling a data input thereinto;
   a second latch control module associated with the device array for controlling a data output therefrom;
   a latch coupled between the second control module and the embedded macro module for continuously examining the data output;
   a tester for inputting a single test signal to the circuit and determining the data access time based on the data output latched in by the latch under the control of the second latch control module,
   wherein the single test signal is provided to the first and second latch control modules through a first branch and a second branch of a test line, respectively, and
   wherein the first branch and the second branch have substantially the same amount of propagation delay time from the tester to the first and second latch control modules, respectively, wherein the tester incermentally increases a pulse width of the single external test signal in one or more test cycles until a latched output is observed from the latch.

9. The system of claim 8 wherein the first and second branches are routing wires of substantially the same length.

10. The system of claim 8 wherein the first and second branches split the single external test signal into a first control signal for enabling the data input at the first latch control module, and a second control signal for latching the data output at the second latch control module.

11. The system of claim 10 wherein the first control signal and the second control signal are 180 degrees out of phase by having an inverter placed on the second branch.

12. The system of claim 8 wherein the embedded macro module is a memory array.

13. The system of claim 8 wherein the latch is a sense amplifier.

14. The system of claim 8 wherein the tester calculates the data access time by considering time delay caused by one or more circuit components between the second control module and the tester.

15. The system of claim 14 wherein the one or more circuit components are input/output modules of the circuit.

16. A method for measuring a data access time of a memory array embedded in an integrated circuit, comprising inputting a single external test signal from an external tester into the circuit for providing a data input to the memory array to cause a data output therefrom;

continuously examining the data output from the memory array by a latch module;

incrementally increasing a pulse width of the single external test signal in one or more test cycles until the data output is observed; and obtaining the data access time, which substantially equals a time interval of the increased pulse width, wherein the single external test signal splits into a first control signal for enabling the data input to be provided to the memory array, and a second control signal for enabling a latching of the examined data output, and wherein time delays of the first and second control signals travel through the circuit are substantially the same.

17. The method of claim 16 wherein the first control signal and the second control signal are 180 degrees our of phase.

18. The method of claim 16 wherein the latch module is a sense amplifier.

* * * * *

UNITED STATES PATENT AND TRADEMARK OFFICE
CERTIFICATE OF CORRECTION

PATENT NO. : 7,212,939 B2 Page 1 of 1
APPLICATION NO. : 11/061020
DATED : May 1, 2007
INVENTOR(S) : Chen-Hui Hsieh, Hau-Tai Shieh and Tao-Ping Wang It is certified that error appears in the above-identified patent and that said Letters Patent is hereby corrected as shown below:

Column 4, line 4, delete "tat" and insert therefore -- that --.

Column 6, line 46, delete "art" and insert therefore -- an --.

Column 7, line 1, delete "incermentally" and insert therefore -- incrementally --.

Column 7, line 25, delete "comprising" and insert therefore -- comprising: --.

Column 8, line 18, delete "our" and insert therefore -- out --.

Signed and Sealed this

Eighteenth Day of September, 2007

JON W. DUDAS
*Director of the United States Patent and Trademark Office*